United States Patent
Chen et al.

(10) Patent No.: US 8,373,282 B2
(45) Date of Patent: Feb. 12, 2013

(54) WAFER LEVEL CHIP SCALE PACKAGE WITH REDUCED STRESS ON SOLDER BALLS

(75) Inventors: Yu-Feng Chen, Hsin-Chu (TW); Yu-Ling Tsai, Hsin-Chu (TW); Han-Ping Pu, Taichung (TW); Hung-Jui Kuo, Hsin-Chu (TW); Yu Yi Huang, Yongjing Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 113 days.

(21) Appl. No.: 13/162,394

(22) Filed: Jun. 16, 2011

(65) Prior Publication Data

US 2012/0319270 A1   Dec. 20, 2012

(51) Int. Cl.
*H01L 23/52* (2006.01)
*H01L 23/48* (2006.01)
*H01L 29/40* (2006.01)

(52) U.S. Cl. ........... 257/781; 257/E23.167; 257/736; 257/786; 438/612; 438/614

(58) Field of Classification Search ........... 257/E23.003, 257/E21.508, E23.167, 734, 736–738, 780, 257/781, 784, 786; 438/108, 127, 612–614, 438/618, 622, 678, 688
See application file for complete search history.

(56) References Cited

U.S. PATENT DOCUMENTS

| | | | | |
|---|---|---|---|---|
| 5,834,844 A * | 11/1998 | Akagawa et al. | ............. | 257/734 |
| 5,946,590 A * | 8/1999 | Satoh | ............. | 438/613 |
| 6,077,726 A * | 6/2000 | Mistry et al. | ............. | 438/108 |
| 6,362,087 B1 * | 3/2002 | Wang et al. | ............. | 438/597 |
| 6,586,323 B1 * | 7/2003 | Fan et al. | ............. | 438/614 |
| 6,656,828 B1 * | 12/2003 | Maitani et al. | ............. | 438/613 |
| 7,023,088 B2 * | 4/2006 | Suzuki et al. | ............. | 257/734 |
| 7,465,653 B2 * | 12/2008 | Huang et al. | ............. | 438/613 |
| 7,582,972 B2 * | 9/2009 | Watanabe | ............. | 257/774 |
| 7,592,205 B2 * | 9/2009 | Chen et al. | ............. | 438/127 |
| 7,855,461 B2 * | 12/2010 | Kuo et al. | ............. | 257/780 |
| 8,053,353 B2 * | 11/2011 | Roy | ............. | 438/622 |
| 2002/0105076 A1 * | 8/2002 | Lin | ............. | 257/738 |

(Continued)

OTHER PUBLICATIONS

"For Semiconductor Wafer Bonding and Through-Silicon Via Applications, Shin-Etsu MicroSi Introduces New Dry Film Dielectric Photoresist,"http://www.marketwire.com/press-release/for-semiconductor-wafer-bonding-through-silicon-via-applications-shin-etsu-microsi-introduces-tse-4063-1214501.htm, Shin-Etsu MicroSi, Jul. 28, 2009, 3 pgs.

(Continued)

*Primary Examiner* — Chris Chu
(74) *Attorney, Agent, or Firm* — Slater & Matsil, L.L.P.

(57) ABSTRACT

A structure includes a metal pad over a semiconductor substrate, a passivation layer having a portion over the metal pad, and a first polyimide layer over the passivation layer, wherein the first polyimide layer has a first thickness and a first Young's modulus. A post-passivation interconnect (PPI) includes a first portion over the first polyimide layer, and a second portion extending into the passivation layer and the first polyimide layer. The PPI is electrically coupled to the metal pad. A second polyimide layer is over the PPI. The second polyimide layer has a second thickness and a second Young's modulus. At least one of a thickness ratio and a Young's modulus ratio is greater than 1.0, wherein the thickness ratio is the ratio of the first thickness to the second thickness, and the Young's modulus ratio is the ratio of the second Young's modulus to the first Young's modulus.

19 Claims, 5 Drawing Sheets

U.S. PATENT DOCUMENTS

2004/0007779 A1* 1/2004 Arbuthnot et al. ............ 257/780

OTHER PUBLICATIONS http://www.jsr.co/jp/pd/it.shtml#cat1, JSR Corporation, downloaded Jun. 16, 2011, 4 pgs. (No English translation.).

"JSR ELPAC™ "WPR Series" Photo-sensitive Insulation Material," http://www.jsr.co/jp/jsr_e/pd/ec/pdf/insulate.pdf, JSR Corporation, downloaded Jun. 16, 2011, 1 pg.

http://www.jsr.co/jp/jsr_e/pd/ec_index.shtml, JSR Corporation product homepage, downloaded Jun. 16, 2011, 3 pgs.

* cited by examiner

WAFER LEVEL CHIP SCALE PACKAGE WITH REDUCED STRESS ON SOLDER BALLS

BACKGROUND

In the formation of a wafer-level chip scale packages (WLCSP), integrated circuit devices such as transistors are first formed at the surface of a semiconductor substrate in a wafer. An interconnect structure is then formed over the integrated circuit devices. A metal pad is formed over, and is electrically coupled to, the interconnect structure. A passivation layer and a first polyimide layer are formed on the metal pad, with the metal pad exposed through the openings in the passivation layer and the first polyimide layer.

Post-passivation interconnect (PPI) is then formed, followed by the formation of a second polyimide layer over the PPI. An under-bump metallurgy (UBM) is formed extending into an opening in the second polyimide layer, wherein the UBM is electrically connected to the PPI. A solder ball is then placed over the UBM and reflowed.

The WLCSP may be bonded to printed circuit boards (PCBs) directly. Conventionally, the WLCSP dies that were directly bonded to the PCBs were small dies. Accordingly, the stresses applied on the solder balls that bond the dies to the respective PCBs were relatively small. Recently, increasingly larger dies need to be bonded to PCBs. The stresses occurring to the solder balls thus become increasingly greater, and the methods for reducing the stresses are needed. However, underfill is avoided to be used in the WLCSP to protect the solder balls. The reason is that if the underfill is applied, the bonding between the dies and the PCBs is not re-workable, and the dies can no longer be removed from the respective PCBs if the dies are defective. As a result, if the underfill is applied, the defective dies cannot be replaced with good dies once bonded, and the entire packages fail.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A wafer level chip scale package (WLCSP) is provided in accordance with an embodiment. The intermediate stages of manufacturing various embodiments are illustrated. The variations of the embodiment are discussed. Throughout the various views and illustrative embodiments, like reference numbers are used to designate like elements.

Figure 1:
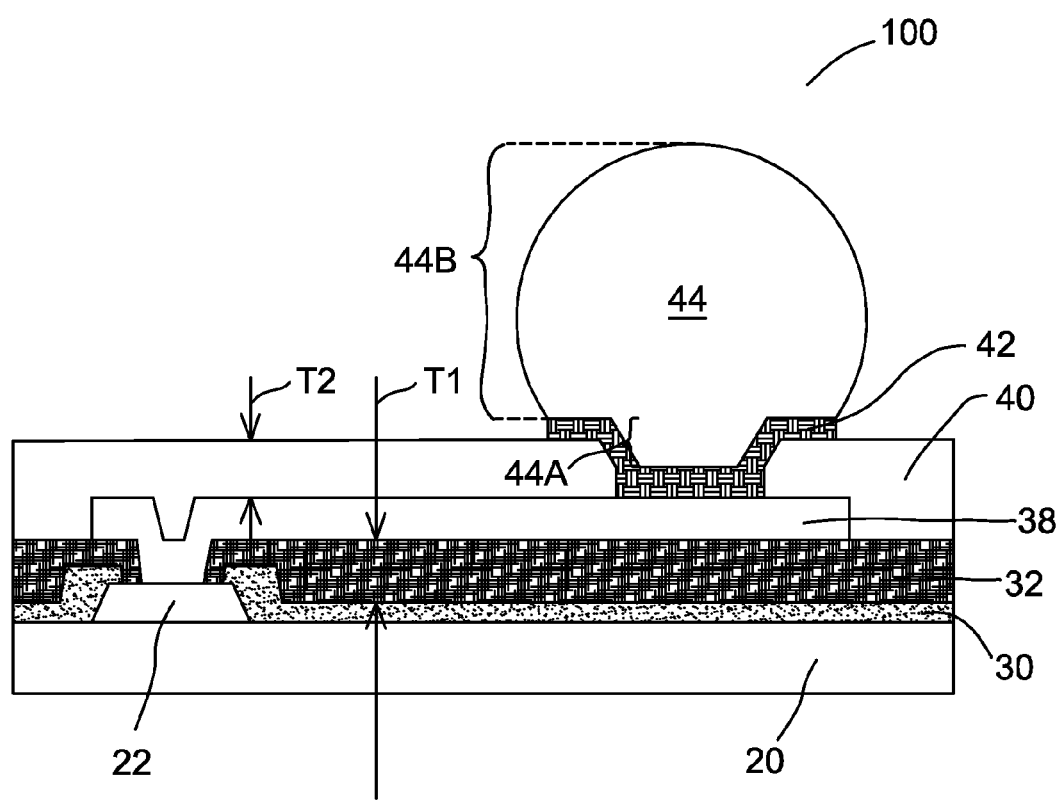
FIG. 1 illustrates a wafer level chip scale package (WLCSP) in accordance with an embodiment.

FIG. 1 illustrates exemplary die 100, which is a WLCSP in accordance with an embodiment. Die 100 may include substrate 20, which may be a semiconductor substrate, such as a silicon substrate, although it may include other semiconductor materials such as silicon germanium, silicon carbon, gallium arsenide, or the like. Active devices such as transistors (not shown) may be formed at the surface of substrate 20. Interconnect structures (not shown), which include metal lines and vias (not shown) formed therein and electrically coupled to the semiconductor devices, is formed over substrate 20. The metal lines and vias may be formed in low-k dielectric layer, which may be extreme (or extra) low-k (ELK) dielectric layers that have dielectric constants smaller than 2.5, or smaller than about 2.0.

Metal pad 22 is formed over the interconnect structure. Metal pad 22 may comprise aluminum, copper, silver, gold, nickel, tungsten, alloys thereof, and/or multi-layers thereof. Metal pad 22 may be electrically coupled to the semiconductor devices, for example, through the underlying interconnect structure. Passivation layer 30, and a first polyimide layer 32 over passivation layer 30, may be formed to cover edge portions of metal pad 22. In an exemplary embodiment, passivation layer 30 is formed of dielectric materials such as silicon oxide, silicon nitride, or multi-layers thereof. An opening is formed in passivation layer 30 and polyimide layer 32 to expose metal pad 22.

Post-passivation interconnect (PPI) 38 is formed, wherein PPI 38 includes a first portion over polyimide layer 32, and a second portion extending into the opening in passivation layer 30 and polyimide layer 32. The second portion of PPI 38 is electrically coupled to, and may contact, metal pad 22. A second polyimide layer 40 may be formed over PPI 38. Under-bump metallurgy (UBM) 42 is formed to extend into an opening in polyimide layer 40, wherein UBM 42 is electrically coupled to PPI 38, and may contact a pad in PPI 38. Bump 44 is formed on the UBM 42. Die 100 may include a plurality of bumps 44. In one embodiment, bump 44 is a solder ball formed and/or placed over UBM 42 and reflowed. Solder ball 44 includes portion 44A, which is located in UBM 42 and polyimide layer 40, and portion 44B, which is over UBM 42 and polyimide layer 40. In some embodiments, bump 44 is a metal pillar formed on the UBM 42.

Figure 2:
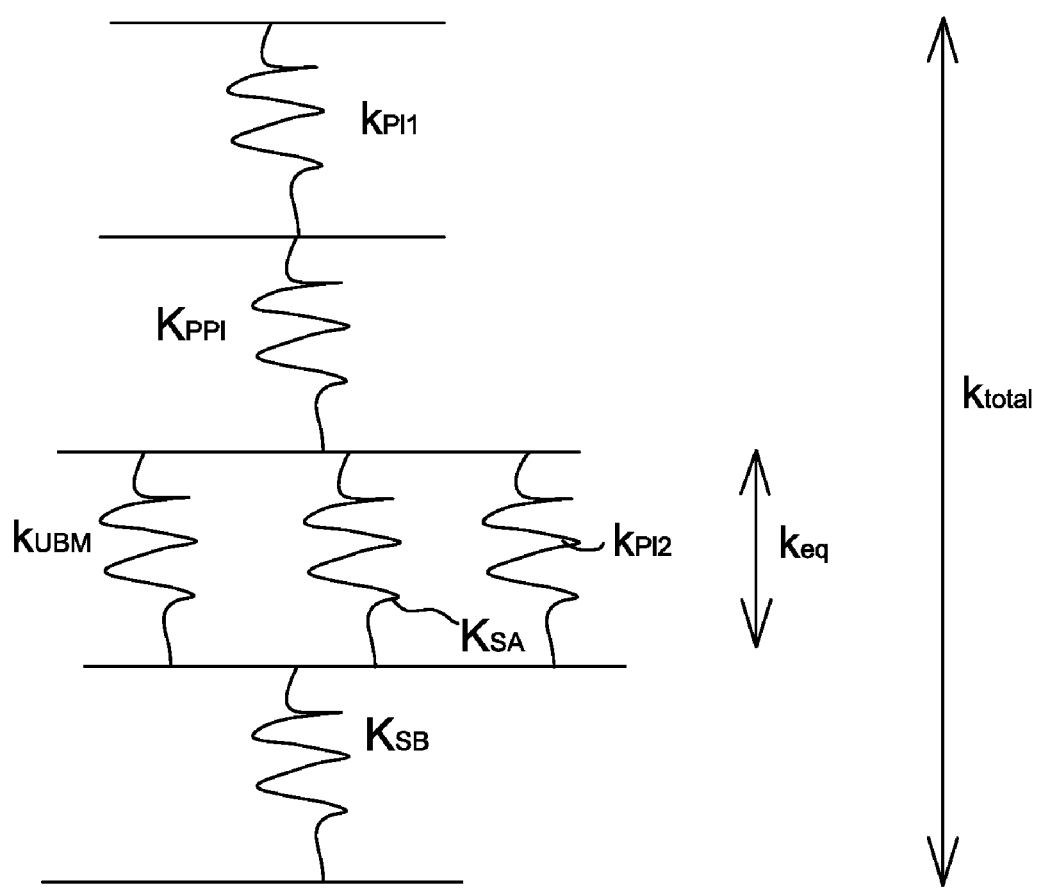
FIG. 2 illustrates a model representing the stiffness of the WLCSP, which is affected by the stiffness values of various regions in the WLCSP.

FIG. 2 illustrates a schematic analysis model, wherein the stiffness values of the materials and regions shown in FIG. 1 are illustrated. The stiffness of each of the materials and regions may be expressed as:

$$k = (A*E)/T \quad \text{[Eq. 1]}$$

wherein k is the stiffness of a region, A is the area of the region, wherein the area is measured from the top view (of FIG. 1) of the region, T is the thickness of the region measured from the cross-sectional view as shown in FIG. 1. In FIG. 2, subscripts are used to specify the specific regions.

In FIG. 2, the stiffness values of regions 32, 38, 40, 42, 44A, and 44B (FIG. 1) are referred to as $k_{PI1}$, $k_{PPI}$, $k_{PI2}$, $k_{UBM}$, $k_{SA}$, and $k_{SB}$, respectively. From the structure shown in FIG. 1, the overall stiffness ($k_{total}$) of the portion of the structure including regions 32, 38, 40, 42, 44A, and 44B may be derived. Stiffness $k_{total}$ may be expressed as:

$$1/k_{total} = 1/k_{PI1} + 1/k_{PPI} + 1/k_{eq} + 1/k_{SB} \quad \text{[Eq. 2]}$$

Wherein equivalent stiffness $k_{eq}$ is further expressed as:

$$k_{eq} = k_{UBM} + k_{SA} + k_{PI2} \quad \text{[Eq. 3]}$$

From equations 1, 2, and 3, it is found that overall stiffness $k_{total}$ is affected by stiffness values $k_{PI1}$, $k_{PPI}$, $k_{PI2}$, $k_{UBM}$, $k_{SA}$, and $k_{SB}$, and reducing each of stiffness values $k_{PI1}$, $k_{PPI}$, $k_{PI2}$, $k_{UBM}$, $k_{SA}$, and $k_{SB}$ may results in the desirable reduction in overall stiffness $k_{total}$. In addition, overall stiffness $k_{total}$ is smaller than the smallest one of stiffness values $k_{PI1}$, $k_{PPI}$, $k_{eq}$, and $k_{SB}$. As expressed in Equation 3, since stiffness $k_{PI2}$ is parallel to stiffness values $k_{UBM}$ and $k_{SA}$, reducing stiffness $k_{PI2}$ is less effective in contributing to the reduction of stiffness $k_{total}$ than reducing stiffness $k_{PI1}$. In some embodiments, stiffness $k_{eq}$ is dominated by stiffness $k_{UBM}$, which is likely to have the greatest value among $k_{UBM}$, $k_{SA}$, and $k_{PI2}$.

Stiffness $k_{total}$ is related to the stress applied on solder ball 44 as in FIG. 1, and the smaller stiffness $k_{total}$ is, the smaller stress is applied on solder ball 44, and the more reliable die 100 is. Therefore, it is desirable to reduce stiffness $k_{total}$.

Figure 4:
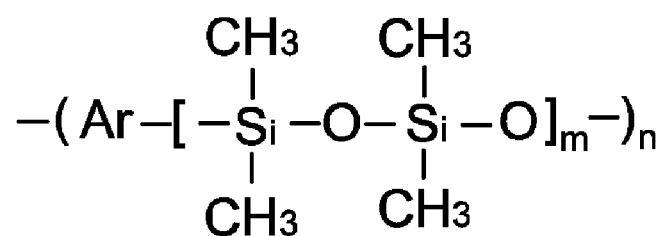
FIGS. 4 through 6 illustrate chemical formulas of photo resist materials used in the WLCSP as in FIG. 1.

In an embodiment, the reduction in stiffness $k_{total}$ is achieved by adopting materials having small Young's modulus to form polyimide layers 32 and 40. For example, the Young's modulus of polybenzoxazole (PBO) is about 2.0 GPa, and materials having Young's modulus equal to or smaller than about 2.0 GPa, lower than about 1.5 GPa, or lower than about 1.0 GPa, may be used. For example, a photo resist material known as DFS, which is a dry film photoresist material from ShinEtsu MicroSi Inc., and has a product name SINR-3170. DFS comprises a resin whose main group is a siloxane group, which is represented by the chemical formula shown in FIG. 4. DFS has a Young's modulus equal to about 0.48 GPa. Furthermore, DFS has a low Young's modulus during an temperature range between −55° C. and 200° C., which temperature range is greater than the temperature range that die 100 may be operated at. Accordingly, DFS is suitable for forming polyimide layers 32 and 40.

Figure 5:
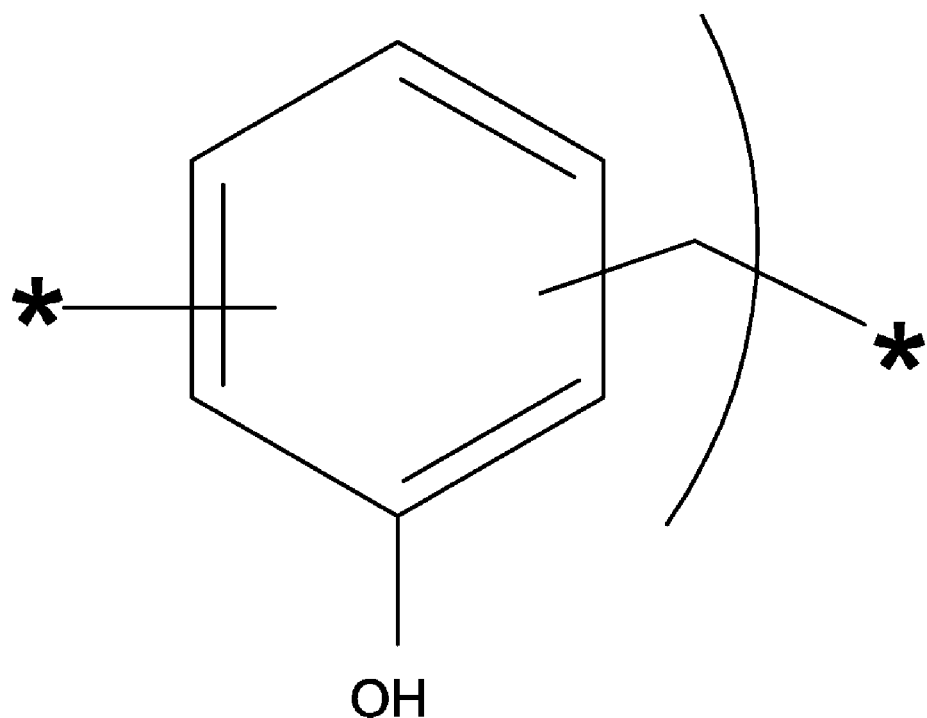
Figure 6:
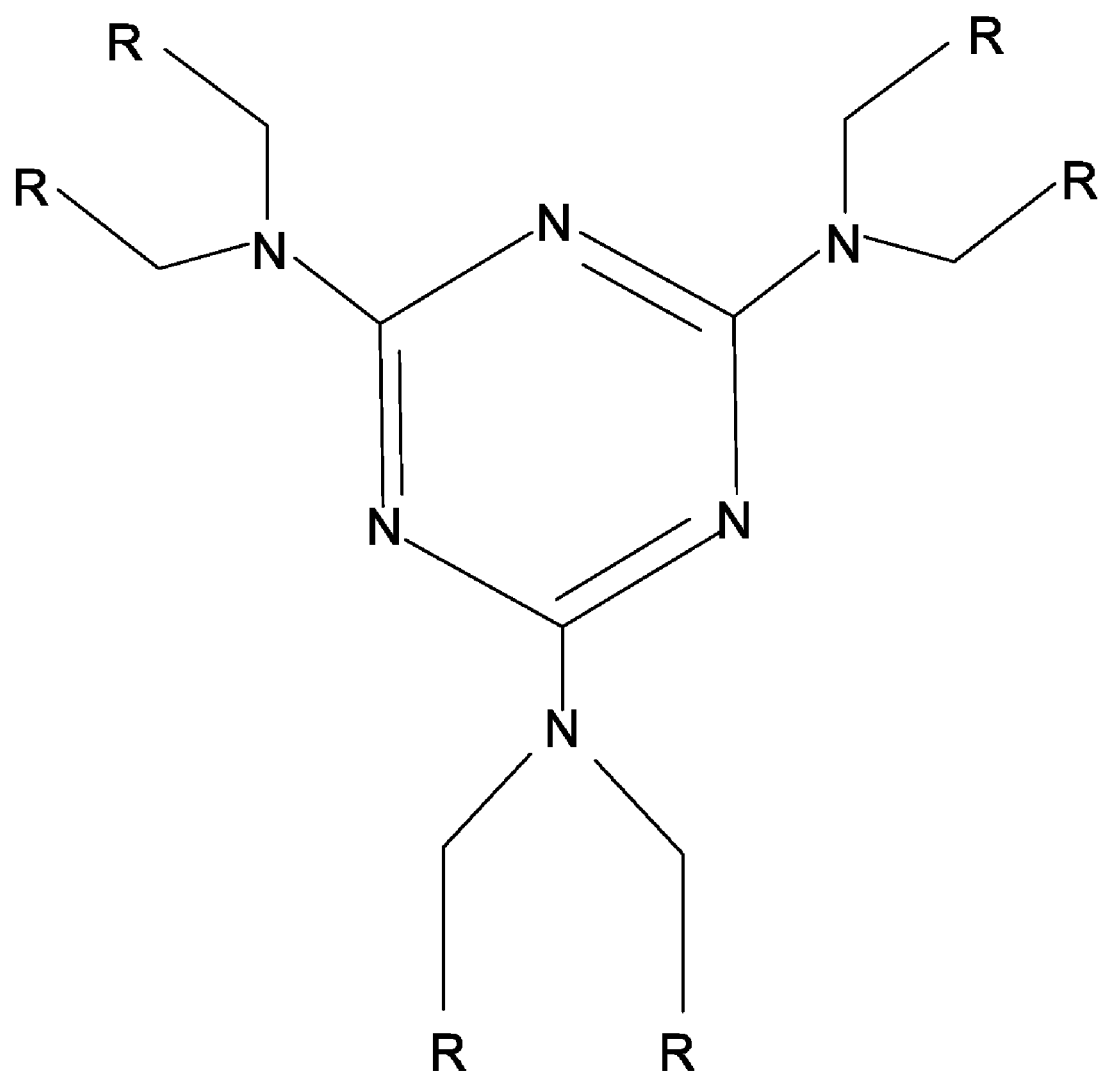

In an embodiment, polyimide layers 32 and 40 are formed using a same material such as DFS. In alternative embodiments, polyimide layers 32 and 40 are formed of different materials, wherein the Young's modulus of polyimide layer 32 is smaller than the Young's modulus of polyimide layer 40. The difference between Young's modulus of polyimide layer 40 and Young's modulus of polyimide layer 32 may be greater than about 0.2 GPa, greater than about 0.5 GPa, or greater than about 1.0 GPa. For example, polyimide layer 32 may be formed of DFS, while polyimide layer 40 is formed of PBO. Alternatively, polyimide layer 32 may be formed of DFS or PBO, while polyimide layer 40 may be formed of a photo resist material known as JSR, which is from the JSR Corporation, and has a product No. WPRR-1201. The base resin of the JSR comprises phenol resin, which has a chemical formula shown in FIG. 5. The photo acid generator of the JSR comprises a triazine compound. The cross-linker of the JSR comprises a melamine compound, which has a chemical formula shown in FIG. 6. The sub cross-linker of the JSR comprises a low molecular epoxy compound. The coupling agent of the JSR comprises a low molecular Si compound. The solvent of the JSR comprises ethyl lactate, 2-Heptanone, or combinations thereof. JSR has Young's modulus equal to about 2.3 GPa.

The reduction in overall stiffness $k_{total}$ may also be achieved by increasing thickness T1 (FIG. 1) of polyimide layer 32. In an embodiment, thickness T1 is measured at a location directly over PPI 38. As shown by Equation 1, increasing thicknesses T1 and T2 may result in the further reduction in stiffness $k_{total}$. However, to maintain the total thickness (T1+T2) not to be excessive, thickness T2 may not be increased or reduced. In some embodiments, thickness ratio T1/T2 is greater than 1.0, greater than about 1.2, and may be greater than about 1.5. Thickness T1 may also be greater than about 11 μm, 20 μm, 30 μm, or 40 μm. In the embodiments in which thickness T1 of polyimide layer 32 is increased, the materials having relative high Young's modulus may also be used without significantly increase stiffness $k_{total}$. In these embodiments, exemplary materials of each of polyimide layers 32 and 40 include JSR, PBO, DFS, and the like.

In yet other embodiments, the reduction in stiffness $k_{total}$ may also be achieved by adopting the materials having small Young's modulus, and simultaneously increasing thickness T1 of polyimide layer 32.

Figure 3:
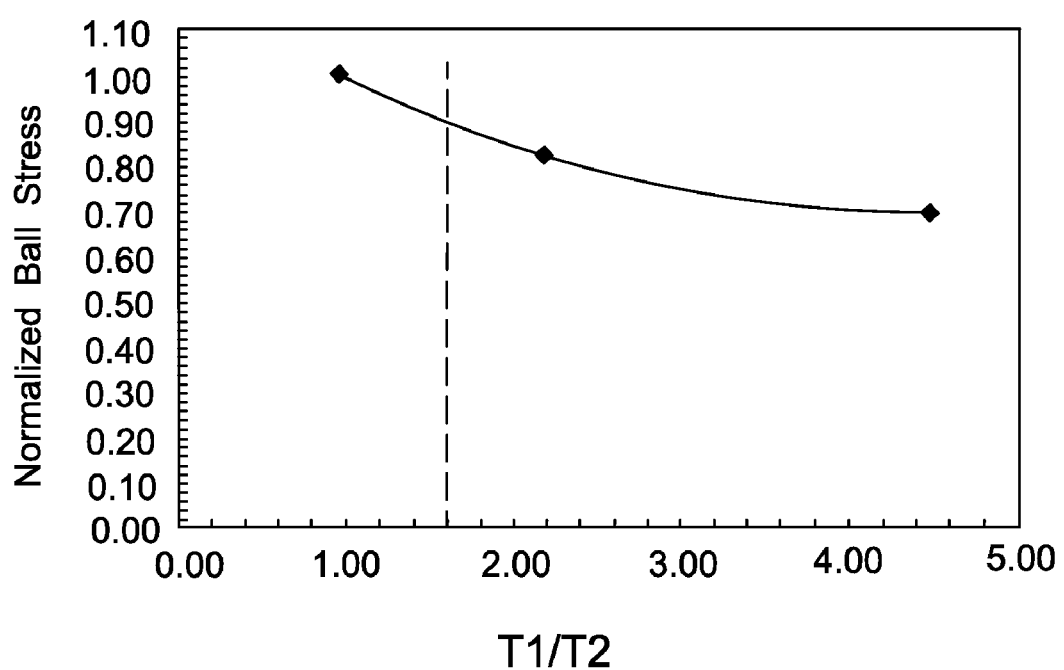
FIG. 3 illustrates normalized accumulated stress in solder balls as a function of thickness ratio T1/T2.

FIG. 3 illustrates simulation results revealing the relationship between ratio T1/T2 and normalized accumulated stress in solder ball 44. It is observed that with the increase in thickness ratio T1/T2, the normalized ball strain reduces. When thickness ratio T1/T2 is increased to about 1.5, the normalized stress may be reduced by 10 percent compared to the stress when ratio T1/T2 is equal to 1.

Table 1 illustrates simulation results obtained from sample dies having the structure as shown in FIG. 1, wherein the polyimide layers 32 and 40 have different combinations of materials and thicknesses were used to form the sample dies. The normalized accumulated stresses in solder balls 44 of the sample dies are obtained after one thermal cycle.

TABLE 1

|  | Sample 1 | Sample 2 | Sample 3 | Sample 4 | Sample 5 | Sample 6 | Sample 7 |
|---|---|---|---|---|---|---|---|
| PI1 Type | PBO | JSR | JSR | JSR | JSR | DFS | DFS |
|  | 7.5 μm | 7.5 μm | 18 μm | 40 μm | 9 μm | 7.5 μm | 30 μm |
| PI2 Type | PBO | JSR | JSR | JSR | JSR | DFS | DFS |
|  | 7.5 μm | 7.5 μm | 9 μm | 9 μm | 18 μm | 7.5 μm | 7.5 μm |
| ELK Stress | 1.04 | 1.10 | 0.75 | 0.51 | 0.97 | 0.67 | 0.45 |
| Ball Strain | 1.51 | 1.55 | 1.31 | 1.06 | 1.51 | 1.17 | 0.71 |

In Table 1, the row marked as "PI1 Type" shows the material and the thickness of polyimide layer 32 in FIG. 1, and the row marked as "PI2 Type" shows the material and the thickness of polyimide layer 40 in FIG. 1. The row marked as "Ball Strain" shows the normalized maximum stress (referred to as normalized ball strain hereinafter) in solder balls (such as 44), which stress is simulated after one thermal cycle is simulated as performed to the respective sample dies. From Table 1, it is observed that with the increase in the thicknesses and the reduction in the Young's modulus of polyimide layers 32 and 40, the normalized ball strain reduces.

Comparing samples 1, 2, and 6, it is observed when JSR (with Young's modulus equal to about 2.3 GPa) is used to form polyimide layers 32 and 40 (sample 2), the normalized ball strain increases over that in sample 1, in which the corresponding polyimide layers 32 and 40 are formed of PBO (with Young's modulus equal to about 2.0 GPa). Conversely, when DFS (with Young's modulus equal to about 0.48 GPa) is used to form polyimide layers 32 and 40 (sample 6), the normalized ball strain is reduced compared to that in sample 1. This indicates that smaller Young's modulus is beneficial for reducing the stress in solder balls 44.

The comparison of samples 3 and 5 indicates that increasing thickness T1 of polyimide layer 32 has a better effect than increasing thickness T2 of polyimide layer 40. The comparison of samples 3 and 4 and the comparison of samples 6 and 7 indicate that increasing thickness T1 of polyimide layer 32 may result in the significant reduction in the normalized ball strain. The maximum effect in the reduction of the normalized ball strain is achieved on sample 7, in which thickness T1 is increased to four times T2, and DFS is used for forming polyimide layers 32 and 40.

In addition to normalized accumulated stress in solder balls 44, the stresses in extreme low-k (ELK) dielectric layers in die 100 is also simulated. The results in Table 1 indicate that the stresses in ELK dielectric layers have the same trend as the normalized accumulated stress in solder balls 44 when the thicknesses and the Young's modulus values of polyimide layers 32 and 40 are changed. Accordingly, the ELK dielectric layers in dies may also benefit from the embodiments when the thickness of polyimide layer 32 is increased, and the Young's modulus of polyimide layer 32 is reduced.

In accordance with embodiments, a structure includes a metal pad over a semiconductor substrate, a passivation layer having a portion over the metal pad, and a first polyimide layer over the passivation layer, wherein the first polyimide layer has a first thickness and a first Young's modulus. A PPI includes a first portion over the first polyimide layer, and a second portion extending into the passivation layer and the first polyimide layer. The PPI is electrically coupled to the metal pad. A second polyimide layer is over the PPI. The second polyimide layer has a second thickness and a second Young's modulus. At least one of a thickness ratio and a Young's modulus ratio is greater than 1.0, wherein the thickness ratio is the ratio of the first thickness to the second thickness, and the Young's modulus ratio is the ratio of the second Young's modulus to the first Young's modulus.

In accordance with other embodiments, a structure includes a metal pad over a semiconductor substrate, and a passivation layer having a portion over the metal pad. A first polyimide layer is over the passivation layer. A PPI includes a first portion over the first polyimide layer, and a second portion extending into the passivation layer and the first polyimide layer. The PPI is electrically coupled to the metal pad. A second polyimide layer is over the PPI, wherein the first polyimide layer has a first Young's modulus smaller than a second Young's modulus of the second polyimide layer. An UBM extends into the second polyimide layer and electrically connected to the PPI. A solder ball is on the UBM.

In accordance with yet other embodiments, a structure includes a metal pad over a semiconductor substrate. A passivation layer includes a portion over the metal pad. A first polyimide layer is formed over the passivation layer. A PPI includes a first portion over the first polyimide layer, and a second portion extending into the passivation layer and the first polyimide layer, wherein the PPI is electrically coupled to the metal pad. A second polyimide layer is over the PPI, wherein the first polyimide layer has a first thickness greater than a second thickness of the second polyimide layer. A UBM extends into the second polyimide layer and electrically connected to the PPI. A solder ball is formed on the UBM.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A structure comprising:
    a semiconductor substrate;
    a metal pad over the semiconductor substrate;
    a passivation layer over the semiconductor substrate and comprising a portion over the metal pad;
    a first polyimide layer over the passivation layer, wherein the first polyimide layer has a first thickness and a first Young's modulus;
    a post-passivation interconnect (PPI) comprising a first portion over the first polyimide layer, and a second portion extending into the first polyimide layer and electrically coupled to the metal pad; and
    a second polyimide layer over the PPI, wherein the second polyimide layer has a second thickness and a second Young's modulus, and wherein at least one of a thickness ratio and a Young's modulus ratio is greater than 1.0, with the thickness ratio being equal to the ratio of the first thickness to the second thickness, and the Young's modulus ratio being equal to the ratio of the second Young's modulus to the first Young's modulus.

2. The structure of claim 1, wherein the thickness ratio is greater than about 1.5.

3. The structure of claim 1, wherein the second Young's modulus is greater than the first Young's modulus by a difference greater than about 0.5 GPa.

4. The structure of claim 1, wherein the first polyimide layer is formed of a photo resist material comprising a resin represented by a soloxane group.

5. The structure of claim 4, wherein the second polyimide layer is formed of the photo resist material comprising the resin represented by the soloxane group.

6. A structure comprising:
    a semiconductor substrate;
    a metal pad over the semiconductor substrate;
    a passivation layer over the semiconductor substrate and comprising a portion over the metal pad;
    a first polyimide layer over the passivation layer;
    a post-passivation interconnect (PPI) comprising a first portion over the first polyimide layer, and a second portion extending into the first polyimide layer and electrically coupled to the metal pad;
    a second polyimide layer over the PPI, wherein the first polyimide layer has a first Young's modulus smaller than a second Young's modulus of the second polyimide layer;
    an under bump metallurgy (UBM) extending into the second polyimide layer and electrically connected to the PPI; and
    a bump on the UBM.

7. The structure of claim 6, wherein the first polyimide layer is formed of a photo resist material comprising a resin represented by a soloxane group.

8. The structure of claim 6, wherein the first Young's modulus is smaller than the second Young's modulus by a difference greater than about 0.5 GPa.

9. The structure of claim 6, wherein the first polyimide layer is formed of a material having Young's module lower than about 1.5 GPa.

10. The structure of claim 9, wherein the second polyimide layer is formed of polybenzoxazole (PBO).

11. The structure of claim 6, wherein the first polyimide layer has a first thickness greater than a second thickness of the second polyimide layer.

12. The structure of claim 11, wherein a ratio of the first thickness to the second thickness is greater than about 1.5.

13. A structure comprising:
   a semiconductor substrate;
   a metal pad over the semiconductor substrate;
   a passivation layer over the semiconductor substrate and comprising a portion over the metal pad;
   a first polyimide layer over the passivation layer;
   a post-passivation interconnect (PPI) comprising a first portion over the first polyimide layer, and a second portion extending into the first polyimide layer and electrically coupled to the metal pad;
   a second polyimide layer over the PPI, wherein the first polyimide layer has a first thickness greater than a second thickness of the second polyimide layer;
   an under bump metallurgy (UBM) extending into the second polyimide layer and electrically connected to the PPI; and
   a bump on the UBM.

14. The structure of claim 13, wherein a ratio of the first thickness to the second thickness is greater than about 1.5.

15. The structure of claim 13, wherein the first polyimide layer has a first Young's modulus smaller than a second Young's modulus of the second polyimide layer.

16. The structure of claim 15, wherein a difference between the first Young's modulus and the second Young's modulus is greater than about 0.5 GPa.

17. The structure of claim 13, wherein the first polyimide layer is formed of a photo resist material comprising a resin represented by a soloxane group.

18. The structure of claim 17, wherein the second polyimide layer is formed of polybenzoxazole (PBO).

19. The structure of claim 13, wherein the first polyimide layer is formed of a material having Young's module lower than about 1.5 GPa.

* * * * *